(12) United States Patent
Hassan et al.

(10) Patent No.: US 11,402,240 B2
(45) Date of Patent: Aug. 2, 2022

(54) STRUCTURED OPTICAL FIBRE SENSOR INTEGRATING A TUNABLE VERNIER EFFECT LASER EMISSION DEVICE

(71) Applicant: COMMISSARIAT A L'ENERGIE ATOMIQUE ET AUX ENERGIES ALTERNATIVES, Paris (FR)

(72) Inventors: Karim Hassan, Grenoble (FR); Quentin Wilmart, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/173,406

(22) Filed: Feb. 11, 2021

(65) Prior Publication Data
US 2021/0255006 A1 Aug. 19, 2021

(30) Foreign Application Priority Data

Feb. 19, 2020 (FR) ...................................... 2001660

(51) Int. Cl.
*H01S 5/10* (2021.01)
*G01D 5/353* (2006.01)
(Continued)

(52) U.S. Cl.
CPC ..... *G01D 5/35322* (2013.01); *G01D 5/35329* (2013.01); *H01S 5/10* (2013.01); *H01S 5/124* (2013.01); *H01S 5/3013* (2013.01)

(58) Field of Classification Search
CPC ........... G01D 5/35322; G01D 5/35329; G01D 5/35335; G01D 5/35316; H01S 5/10;
(Continued)

(56) References Cited

U.S. PATENT DOCUMENTS 9,748,726 B1 * 8/2017 Morton .................. H01S 3/083
10,267,989 B2    4/2019 Hassan et al.
(Continued)

FOREIGN PATENT DOCUMENTS

EP          2 811 257 A1    12/2014

OTHER PUBLICATIONS

French Preliminary Search Report dated Jul. 28, 2015 in French Application 20 01660 filed Feb. 19, 2020 (with English Translation of Categories of Cited Documents).
(Continued)

*Primary Examiner* — Jonathan M Hansen
(74) *Attorney, Agent, or Firm* — Oblon, McClelland, Maier & Neustadt, L.L.P.

(57) ABSTRACT

The invention is concerned with a structured optical fibre sensor, comprising a light source (1), a detection system (2) and a Bragg grating optical fibre (3) connected to said source and said system. The light source is a wavelength-tunable laser emission device (1) comprising a cavity (CA) delimited by a first and a second Sagnac mirror (M1, M2). The cavity comprises an amplifying medium (AM) and a tunable spectral filter using the Vernier effect (F), said filter (F) comprising at least three resonant rings ($R_1$, $R_2$, $R_{N-1}$, $R_N$) arranged in cascade, each resonant ring integrating a wavelength-tunable reflectivity loop mirror (MBR).

7 Claims, 5 Drawing Sheets

(51) Int. Cl.
*H01S 5/12* (2021.01)
*H01S 5/30* (2006.01)

(58) Field of Classification Search
CPC ........ H01S 5/124; H01S 5/3013; H01S 5/142;
H01S 5/0612; H01S 5/06821; H01S 5/1032
See application file for complete search history.

(56) References Cited

U.S. PATENT DOCUMENTS

| | | | |
|---|---|---|---|
| 10,295,742 B2 | 5/2019 | Hassan et al. | |
| 10,302,870 B2 | 5/2019 | Hassan et al. | |
| 10,466,570 B2 | 11/2019 | Hassan et al. | |
| 10,551,563 B2 | 2/2020 | Hassan et al. | |
| 10,649,146 B2 | 5/2020 | Hassan et al. | |
| 10,768,454 B2 | 9/2020 | Wilmart et al. | |
| 2006/0222038 A1* | 10/2006 | Yamazaki | H01S 5/1032 372/94 |
| 2008/0259437 A1* | 10/2008 | Suzuki | H01S 5/065 359/326 |
| 2015/0139264 A1* | 5/2015 | Zhang | H01S 5/1032 372/107 |
| 2017/0353001 A1* | 12/2017 | Takabayashi | H01S 5/1007 |

OTHER PUBLICATIONS

Komljenovic, T. et al., "Widely-Tunable Ring-Resonator Semiconductor Lasers," Applied Sciences, vol. 7, No. 7, Jul. 17, 2017, XP055688482, 21 pages.

Li, A. et al., "Fundamentally Cancel Backscattering in Silicon Microrings," 2017 conference on Lasers and electro-optics Europe & European Quantum Electronics conference (CLEO/Europe-EQEC), Jun. 25, 2017, XP033240055, 1 page.

Elfaiki, H. et al., "Ultra Wide Hybrid III-V On Silicon Tunable Laser," 2018 European Conference on Optical Communication (ECOC), 2018, 3 pages.

Li, A et al., "Fundamental suppression of backscattering in silicon microrings," Optics Express, vol. 25, No. 3, Feb. 6, 2017, 8 pages.

Li, Y. et al. "Tilted silicon-on-insulator grating coupler with improved fiber coupling efficiency and low back reflection based on a silicon overlay," IEEE Photonics Technology Letters, vol. 25, No. 13, Jul. 2013, 4 pages.

Hassan, K. et al., "Robust silicon-on-insulator adiabatic splitter optimized by metamodeling," Applied Optics, vol. 56, No. 8, Mar. 10, 2017, 6 pages

* cited by examiner

STRUCTURED OPTICAL FIBRE SENSOR INTEGRATING A TUNABLE VERNIER EFFECT LASER EMISSION DEVICE

TECHNICAL FIELD

The field of invention is that of structured optical fibre sensors comprising a light source, a detection system and a Bragg grating optical fibre connected to said source and said system. Within this scope, the invention is concerned with a structured optical fibre sensor whose light source is a laser emission device tunable over a wide range of emission wavelengths.

PRIOR ART

The emergence of new Structural Health Monitoring (SHM) systems requires the development of new on-chip sensors, in particular in the aviation field for, for example, real-time monitoring of stresses in engines.

Bragg grating optical fibres have thus been developed to allow different types of stress measurements (deformation, temperature change, etc.) under extreme operating conditions. These fibre-optic sensors are made by structuring micro-nanometric defects in the core of the silica fibres with femtosecond lasers at a regular pitch, thus forming Bragg mirrors with spectral bandwidths of a few tens of picometers. In practice, several Bragg gratings with windows of different reflectivities (different Bragg grating pitches) are made in the same fibre in order to measure stresses of the system in different locations.

When a stress is applied to the fibre, the reflectivity window shifts, which can be detected either by using a wideband "white" source and calibrated detection (filter(s)+ photodiodes), or by using a calibrated tunable laser source and a photodiode measuring reflectivity variations. In this second case, manufacturers search for a wide tunability range of the laser source in the order of 120 to 160 nm.

First demonstrations of wavelength-tunable semiconductor lasers date back to the 1980s with Distributed Bragg Grating (DBR) lasers that make use of mirrors as an optical feedback structure for forming a resonant cavity for an amplifying medium.

Since then, the operating principle of tunable lasers has remained the same, with a Fabry-Pérot cavity optically closed by two mirrors, at least one of which is partially reflective, and a spectral filtering element which in the case of a DBR laser is actually integrated into the mirror function. In order to maximise power emitted and to ensure a single frequency behaviour of the laser, the wavelength favoured by the filter should be coincident with one of the possible modes of the Fabry-Pérot cavity, adjustable by a phase section, and if possible positioned in a spectral zone where the gain is high.

In order to increase tunability of semiconductor lasers, which is limited to about 10 nm with a DBR filter, it is possible to modify Bragg gratings by adding slightly different sub-periodicities in order to benefit from a Vernier effect using a method known as SG-DBR ("Sampled-Grating DBR"). This modification allowed a tunability greater than 50 nm to be demonstrated. Nevertheless, SG-DBR mirrors have to be long enough to perform their filtering function properly, which results in a very low efficiency of the heating elements used to tune them and therefore a high energy operating cost.

To remedy this, it is possible to replace a DBR with separate filtering and reflecting elements, respectively a ring resonator and a Sagnac mirror which is a loop mirror known to be a good achromatic mirror.

As reported in the publication by Hajar Elfaiki et al. "Ultra-Wide Hybrid III-V on Silicon Tunable Laser", ECOC 2018, it is possible to achieve 90 nm tunability by making use of a multiple ring resonator consisting of two resonant rings placed in series, these two rings having very slightly different perimeters in order to achieve a Vernier effect. Indeed, the difference in perimeter generates a difference in free spectral range (FSR) so that the transmission combs of the two rings with slightly different FSRs will only coincide at some transmission peaks. The ring resonator then has a higher total FSR than each ring.

In such a tunable spectral filter using a Vernier effect obtained by means of two rings, the free spectral interval is effectively given by $$FSR_t = \frac{FSR1 \times FSR2}{FSR2 - FSR1}$$

where FSR1 and FSR2 denote the respective free spectral interval of each of the rings. By setting the resonance of one ring and shifting the resonance of the other ring by a multiple of $\Delta FSR = FSR_2 - FSR_1$ (for example using a heater), the overall resonance of the filter can be changed. When switching from one overall resonance to another, the difference in resonance order between the two resonator rings is always less than 1.

In order to obtain a Vernier effect with a wide tunability, rings with small perimeters are generally utilised as long as their respective free spectral interval is high, thus maximising $FSR_t$. As an example, a tunability of 100 nm could be obtained with two rings with diameters $P_1 = 67.5$ μm and $P_2 \approx 63.59$ μm (that is about 10 μm radius for ng=4.46 at $\lambda = 1310$ nm), thus giving FSR1≈5.7 nm and FSR2≈6.05 nm, that is FSRt≈98 nm.

The increase in tunability beyond 90 nm, however, encounters several phenomena that prevent stable selection of the transmission frequency, either because of increased losses in some spectral bands or because of parasitic reflections.

A technique for limiting parasitic reflections from a resonant ring, reported in the publication by Ang Li and Win Bogaerts, "Fundamental suppression of backscattering in silicon microrings", Opt. Express 25(3) 2017, consists in equipping the resonant ring with a loop mirror with wavelength-tunable reflectivity by means of a phase control section in the form of a Mach Zehnder interferometer.

However, this technique has a major problem for being utilised in a tunable laser. Indeed, by adding a phase control section and a Sagnac loop, the optical path is dramatically lengthened (around a factor of 3), which reduces the free spectral range of the ring given by $$FSR = \frac{\lambda^2}{n_g P},$$

where P is the resonator perimeter, ng the group index and $\lambda$ the wavelength.

The utilisation of this technique would lead to perimeters more than three times larger, greater than 200 nm. Starting from a 200 nm long ring, its free spectral range would be, for ng=4.46 at $\lambda$=1310 nm, about 1.924 nm. A tunability of 100 nm could then be achieved by having a second ring with a free spectral range of about 1.9615 nm. But with such a small deviation between the respective FSRs of each ring (ΔFSR≈0.03 nm), the Vernier system transmission turns out to be largely degraded with an SMSR (Side Mode Suppression Ratio) in the order of 12 dB.

It is thus noticed that with ring resonators with a Sagnac loop added, the perimeter is large and therefore the FSR is low (typically <2 nm). ΔFSR can possibly be varied to increase $FSR_f$, but the condition ΔFSR>FWHM (Full Width at Half Maximum) should be fulfilled not to degrade SMSR. Indeed, if the resonances are too close to each other, the system may have an overall resonance that is too little damped and lead to the occurrence of a parasitic laser mode. In conclusion, the technique of limiting parasitic reflections leads to an $FSR_f$ of a 2-ring Vernier system that is too weak for wide tunability.

DISCLOSURE OF THE INVENTION

One purpose of the invention is to provide a structured optical fibre sensor using a semiconductor laser whose tunability would be extended without degrading the SMSR in order to ensure single-frequency laser emission.

For this purpose, the invention provides a structured optical fibre sensor comprising a light source, a detection system and a Bragg grating optical fibre connected to said source and said system. The light source is a wavelength tunable laser emission device which comprises:

a first and a second Sagnac mirror;

a cavity delimited by the first and second Sagnac mirror, the cavity comprising an amplifying medium and a tunable spectral filter using the Vernier effect, said filter comprising at least three resonant rings arranged in cascade, each resonant ring incorporating a loop mirror with wavelength tunable reflectivity.

Some preferred but not limiting aspects of this sensor are as follows:

each resonant ring of said filter includes a Mach-Zehnder interferometric section;

each of the first and second Sagnac mirrors consists of an adiabatic directional coupler looped back through a waveguide;

the cavity further comprises a phase-shifting section;

one of the first and second Sagnac mirrors is partially reflective;

it further comprises, outside the cavity on the side of the one of the first and second Sagnac mirrors which is partially reflective, a tilted grating coupler to/from a single mode optical fibre;

the amplifying medium comprises an III-V heterostructure.

BRIEF DESCRIPTION OF THE DRAWINGS

Further aspects, purposes, advantages and characteristics of the invention will become clearer upon reading the following detailed description of preferred embodiments of the invention, given by way of non-limiting example and with reference to the appended drawings in which.

DETAILED DISCLOSURE OF PARTICULAR EMBODIMENTS

Figure 1:
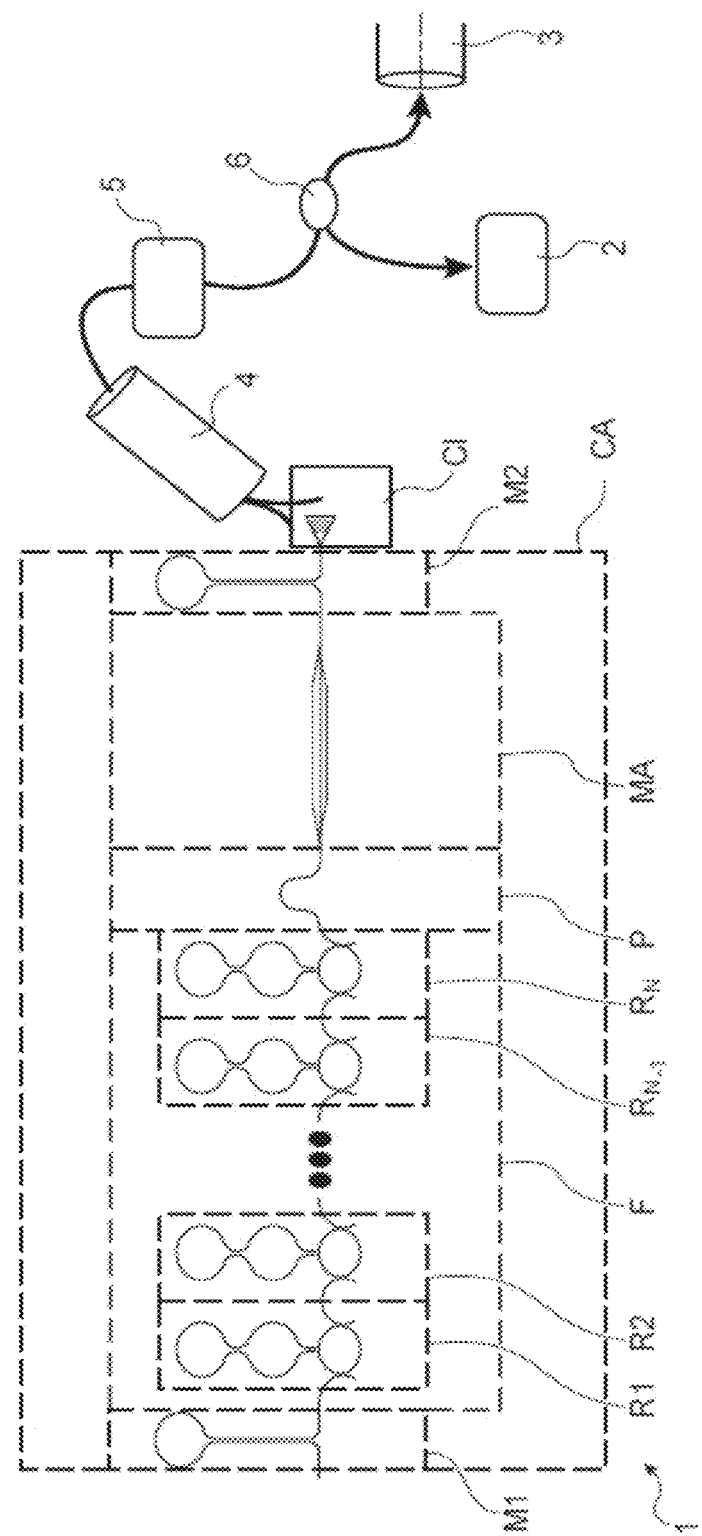
FIG. 1 is a diagram representing a structured optical fibre sensor according to a possible embodiment of the invention.

With reference to FIG. 1, one object of the invention is a structured optical fibre sensor comprising a light source 1, a detection system 2 and a Bragg grating optical fibre 3 connected to said source and said system.

The light source is a wavelength tunable laser emission device 1 which comprises:

a first and a second Sagnac mirror M1, M2;

a cavity Ca delimited by the first and second Sagnac mirror M1, M2, the cavity comprising an amplifying medium AM and a tunable spectral filter using the Vernier effect F.

In a favoured embodiment of the invention, the amplifying medium comprises an III-V heterostructure. By III-V type heterostructure, it is meant the use of binary, ternary, quaternary materials, which may be chosen from the following non-exhaustive list: InP, GaAs, InGaAlAs, InGaAsP, AlGaAs, InAsP, IInAs. The heterostructure of such an amplifying medium, also called a gain medium, may include a stack of various layers, such as a stack of layers forming quantum wells sandwiched between a first doped, preferably N-doped, layer, and a second doped, preferably P-doped, layer.

This favoured mode is thus based on the technology of heterogeneous integration of III-V materials with silicon, which makes it possible to make photonic circuits associating III-V optical sources with silicon-based components. Heterogeneous III-V integration on silicon can especially consist in bonding a portion of active III-V material capable of emitting light onto a "passive" circuit etched on the surface of a silicon-on-insulator (SOI) substrate. A photonic circuit with a hybrid III-V active section on silicon thus generally comprises:

an SOI substrate carrying a silicon waveguide, a gain structure which includes at least one optical amplifying medium with a III-V heterostructure, transferred by bonding to the SOI substrate, a thin oxide layer which serves as a bonding layer and separates the gain structure from the silicon waveguide.

The III-V heterostructure is arranged to overlie a section of the silicon waveguide to form a hybrid waveguide section with the silicon waveguide. At this hybrid waveguide section, the vertical proximity of the III-V and silicon waveguides results in the occurrence of a coupled optical mode resulting from hybridisation between the fundamental eigen modes of each of these guides. This coupled mode is transferred from the active III-V/Silicon hybrid active section to passive pure silicon light propagation sections arranged on either side of the hybrid waveguide section. For this purpose, the silicon waveguide is structured to provide a modal transition section (taper) between the hybrid active section and the propagation sections.

The propagation sections and the hybrid section are delimited by the Sagnac mirrors M1, M2, which thus form an optical feedback structure capable of forming a resonant cavity CA for the amplifying medium AM. One of the mirrors, here M1, is a high reflectivity mirror which for example has a reflectivity of more than 90%, while the other mirror, here M2, is a low reflectivity mirror (partially reflecting mirror) which for example has a reflectivity of less than 50%, typically between 35 and 10%. The low-reflectivity mirror thus forms the optical output of the laser emitting device 1. This optical output is equipped with a grating coupler CI to/from a single-mode optical fibre 4. This grating coupler is preferably a tilted grating which has the advantage of reduced reflectivity. The principle of such a tilted grating is for example described in the publication by Yanlu Li et al, "Tilted silicon-on-insulator grating coupler with improved fibre coupling efficiency and low back reflection based on a silicon overlay", IEEE Photonics Technology Letters, vol. 25, no. 13, pp. 1195-1198, July 2013.

The single-mode optical fibre 4 is coupled to the Bragg grating fibre 3 via an isolator 5 for limiting parasitic reflections and a coupler 6 to which the detection system 2 is also connected. Thus, the laser emitting device sends the light it generates into the Bragg grating fibre 3, and the detector system 2 detects light modified in response to temperature changes or deformations and provides electrical signals for determining these temperature changes or deformations.

As compared with a diffraction-based DBR mirror, a Sagnac mirror is comprised of a directional coupler looped back through a waveguide and operates solely by constructive/destructive interference between two guides, which simplifies manufacturing thereof since there is no sub-wavelength grating to be made. The advantageous Sagnac loop concept has been widely used in the field of optical fibres, field in which where silica guides show very low chromatic dispersion, so that Sagnac fibre loops are considered achromatic. However, this property is no longer valid in integrated optics because when a directional coupler based on silicon microguides is used, the coupling rate is wavelength-dependent. Nevertheless, in a favoured embodiment of the invention, each of the first and second Sagnac M1, M2 mirrors utilises an adiabatic directional coupler. The adiabatic directional coupler has near-perfect relative coupling ratios over 100 nm of bandwidth, typically relative coupling ratios of between 0.45 and 0.55 over the entire bandwidth, for example over a band between 1260 nm and 1360 nm. An example of the development of such an adiabatic coupler is, for example, given in the publication by Karim Hassan et al, "Robust silicon-on-insulator adiabatic splitter optimized by metamodeling", Applied Optics 56(8) 2017.

In addition to the amplifying medium MA, the cavity CA may include a phase P control section capable of tuning the modes of the Fabry-Pérot cavity CA by being thermally controlled by means of a heater located above the section P.

Figure 2:
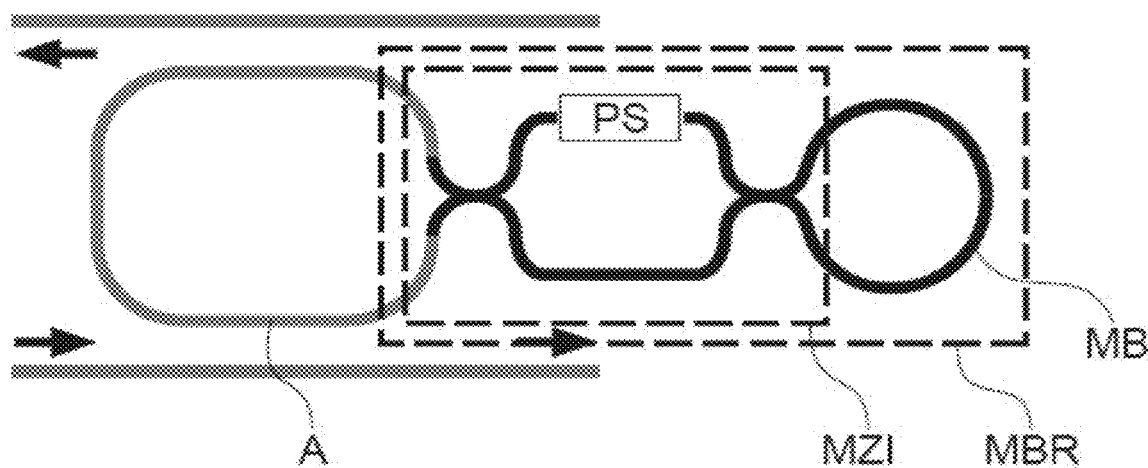
FIG. 2 is a diagram of a resonant ring with a loop mirror with wavelength tunable reflectivity.

The cavity CA additionally includes a tunable spectral filter using the Vernier effect F. This filter is a multi-ring resonator which comprises several resonant rings arranged in cascade. As represented in FIG. 2, each resonant ring A incorporates a loop mirror with wavelength tunable reflectivity MBR. As seen earlier, such rings have low reflectivity due to the addition of the tunable reflectivity loop mirror, which removes back-propagation modes generated by light backscattering. In a favoured embodiment represented in FIG. 2, each resonant ring A incorporates a loop mirror LM and an adjustable phase section. The adjustable phase section is typically a Mach-Zehnder interferometric MZI section comprising two arms able to be phase-shifted from each other by means of a thermo-optical phase-shifting element PS which can act on one of the arms.

The addition to each resonant ring of the adjustable reflectivity mirror significantly increases the effective length of each resonator. As seen previously, this increase reduces the free spectral range, which is not desirable to achieve high tunability. Anyway, in order to take advantage of this type of low-reflectivity resonator while at the same time benefiting from a Vernier effect offering broad tunability, the filter of the sensor emission device according to the invention is not ensured by two rings as is the case in the state of the art, but by a larger number of rings, that is at least three resonant rings R1, R2, $R_{N-1}$, $R_N$ as represented in FIG. 1.

One advantage of such a number of rings is that the overall FSR of the ring systems is no longer restrictive: two resonances can coincide, if the third or fourth resonance does not coincide, there will be no overall resonance of the system. This means that, unlike the case with two rings, the order difference between the resonators can be greater than 1. So there is no need to choose the lowest possible ΔFSR since the tunability is no longer limited by $$FSR_t = \frac{FSR_1 \times FSR_2}{FSR_2 - FSR_1}.$$

Thus, both high tunability and good SMSR can be achieved.

An example of dimensioning the at least three rings of the filter is given below in connection with an example of an embodiment where the filter comprises five rings.

A reference ring with a free spectral range FSR0 is considered. The other rings of the filter have an FSR expressed as $FSR_i = \alpha_i FSR_0$. The free spectral range of the 2-ring subsystems 0 and i is given by $$FSR_{i-0} = \frac{\alpha_i}{1 - \alpha_i} FSR_0$$

while the free spectral range of the N-ring system is given by $$\prod \frac{\alpha_i}{1 - \alpha_i} FSR_0.$$

For example, if four rings are considered such that $FSR_1 = 0.9 * FSR_0$, $FSR_2 = 0.8 * FSR_0$ and $FSR_3 = 0.7 * FSR_0$, the overall free spectral range of the system is 0.9*0.8*0.7/(0.1*0.2*0.3)=84*$FSR_0$, or 126 nm if a typical $FSR_0$ of 1.5 nm is taken. It is therefore noticed that the free spectral range of an N-ring system increases with the number of rings, making a wider range of tunability available.

Let a waveguide with an effective index be $n_{\textit{eff}}$ and a minimum resonant ring perimeter be $L_0$. The lowest wavelength to be reached in the system is chosen: $\lambda_0 = 1.26$ μm. The resonance order of the ring 0 is expressed as $$m_0 = \text{integer}\left(\frac{L_0 n_{\textit{eff}}}{\lambda_0}\right)$$

and its free spectral range is $$FSR_0 = \frac{L_0 n_{eff}}{m_0} - \frac{L_0 n_{eff}}{m_0 - 1}.$$

A tunability range is then chosen, for example $\Delta\lambda=100$ nm, and $\lambda_m=\lambda_0+\Delta\lambda$ is written. The resonance order shift for ring 0 to reach the maximum wavelength is expressed according to $$N = m_0 - \frac{L_0 n_{eff}}{\lambda_m}$$

and the free spectral range of ring 0 at $\lambda_m$ according to $$FSR_m = \frac{L_0 n_{eff}}{m_0 - N} - \frac{L_0 n_{eff}}{m_0 - N - 1}.$$

The selection of the other rings in terms of the difference in free spectral range from the reference ring 0 (typically taking $\Delta FSR > FWHM$) is as follows. The ring i should have a free spectral interval $FSR_i$ by imposing its resonance with the condition $\lambda_i=\lambda_0$. Hence $$m_i = 1 + \text{integer}\left(\frac{\lambda_0}{FSR_i}\right) \text{ and } L_i = \frac{\lambda_0 m_i}{n_{eff}}.$$

Figure 3:
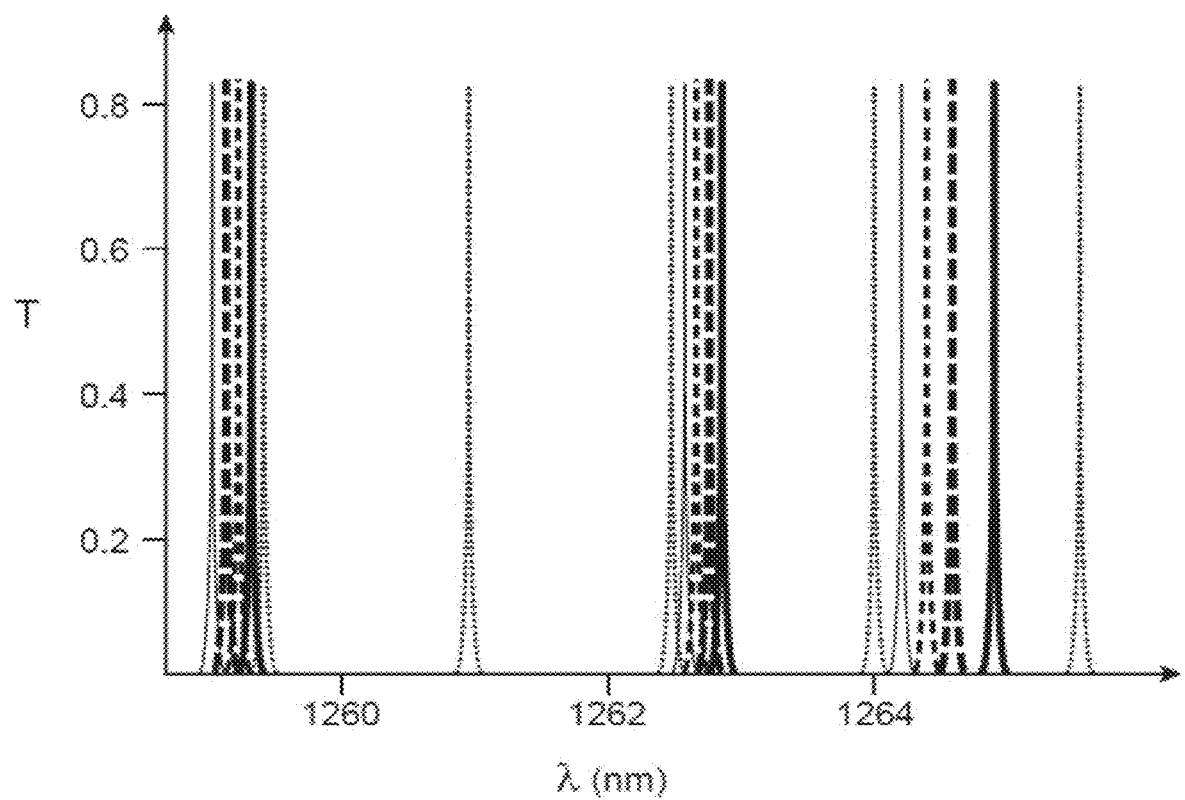
FIG. 3 illustrates coincidence at 1261 nm of the emission peaks of each of five resonant rings of a spectral filter that can be used in the device according to the invention, in the absence of a phase shift applied to the rings.

This choice ensures a coincidence at $\lambda_0$ but is not restrictive on the geometry of the other rings. FIG. 3 illustrates the transmission spectrum T as a function of wavelength of a five-ring filter with diameters 350, 368, 388, 411 and 437 μm respectively, for which a resonance coincidence has been imposed at $\lambda_0=1261$ nm.

Since the filter should be tunable in the range $\Delta\lambda$, a resonance of the ring system is searched for at $\lambda_s$ such that $\lambda_0 < \lambda_s < \lambda_m$. For this, for each ring $N_{i,s}=$ $$m_i - \text{integer}\left(\frac{L_i n_{eff}}{\lambda_s}\right),$$

is determined, that is the resonance order which is closest to $\lambda_s$ at $$\lambda_{i,s} = \frac{n_{eff} L_i}{m_i - N_{i,s}}.$$

Figure 4:
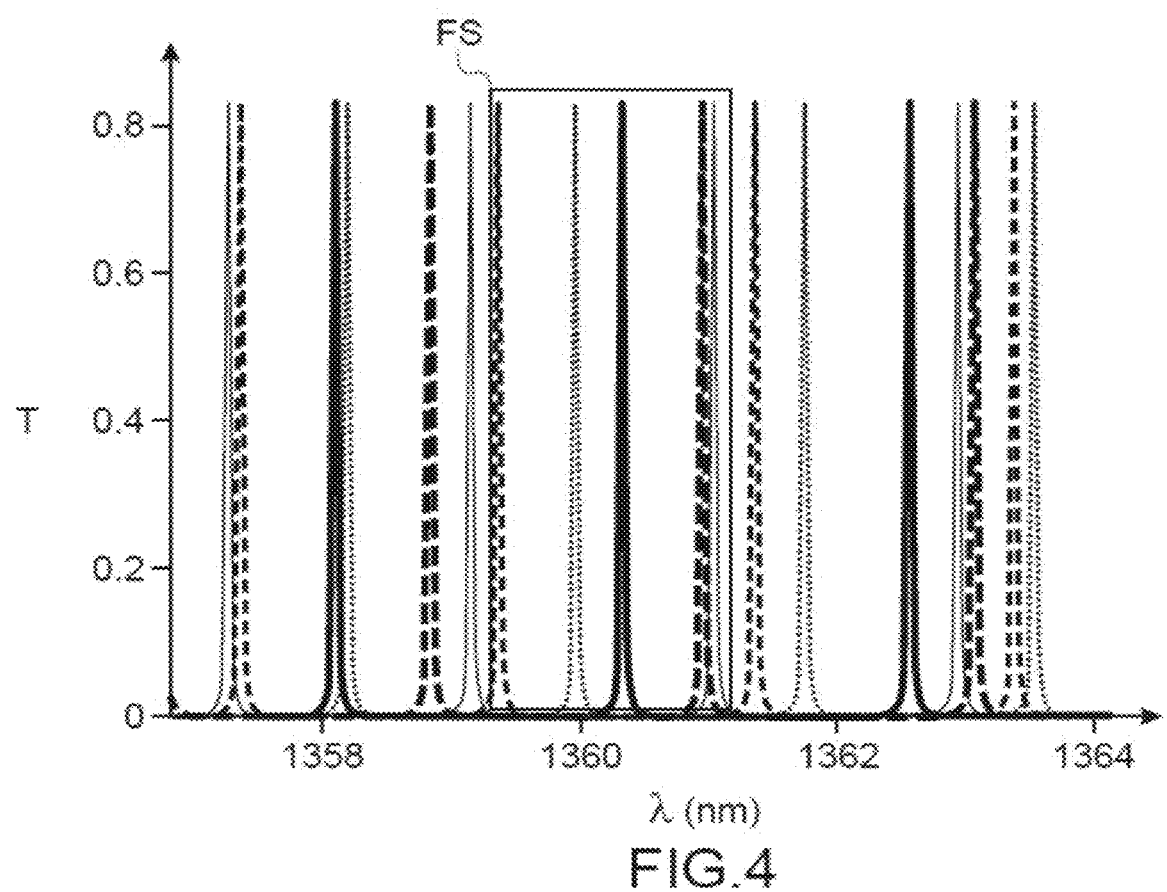
FIG. 4 represents the emission peaks, around 1361 nm, of each of the resonant rings of the five-ring spectral filter, in the absence of phase shift applied to the rings.

The FSR of each ring is then calculated at $\lambda_s$, $FSR_{i,s}$. For a given $\lambda_s$, and as represented by the window FS in FIG. 4, there is always a resonance of each ring at less than half FSR.

The rings are then attempted to be tuned to coincide at $\lambda_s$. The phase shift to be applied to each ring is written as $\Delta\phi_i=2\pi(\lambda_s-\lambda_{i,s})/FSR_{i,s}$. This phase shift can be applied by means of a heater placed above each ring. The individual resonances of the rings at $\lambda_0+100$ nm, have been represented in FIG. 4, in the absence of phase shift applied to the rings.

Figure 5:
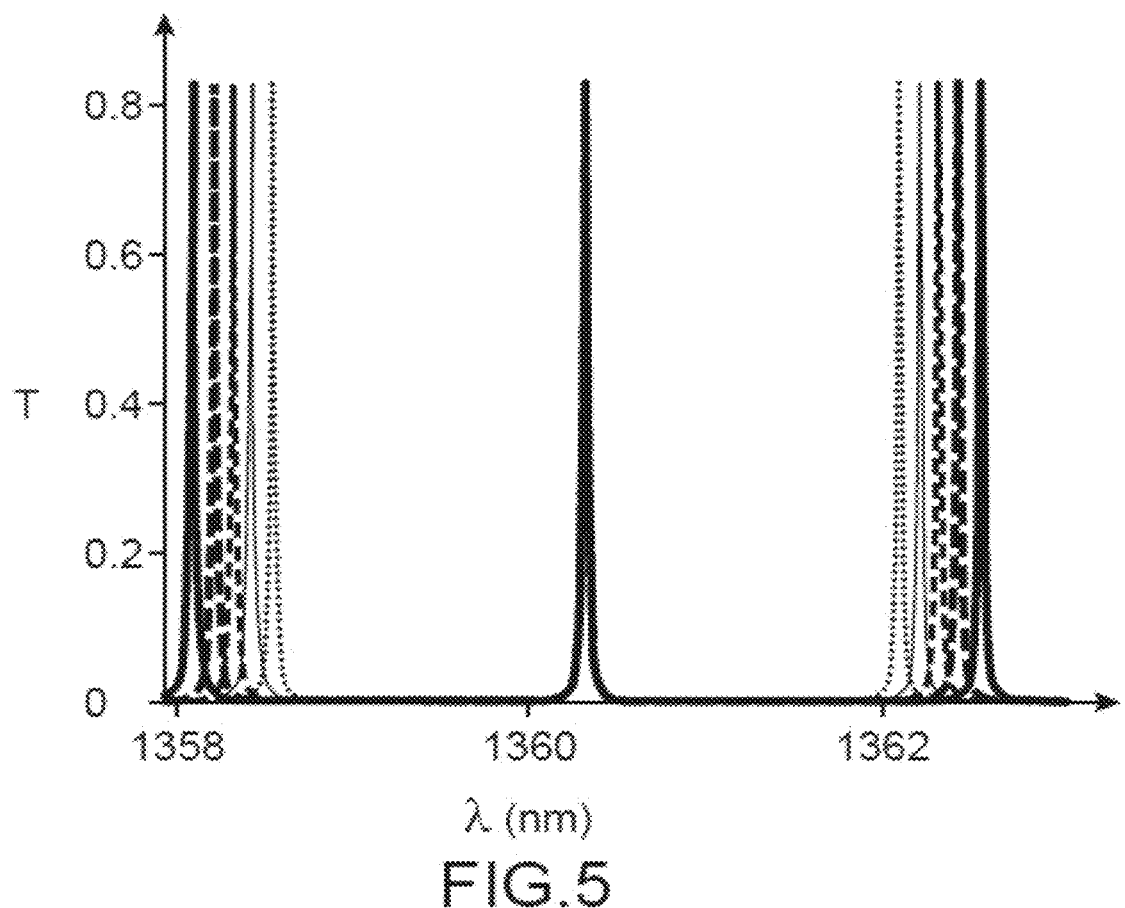
FIG. 5 represents the coincidence at 1361 nm of the emission peaks of each of the resonant rings of the five-ring spectral filter, in the presence of a phase shift applied to the rings.

An absence of overall resonance of the system is noticed. In addition, the individual ring resonances at $\lambda_0+100$ nm, have been represented in FIG. 5, with the $\Delta\phi_i$ phase shift applied. A coincidence in individual resonances and therefore show an overall resonance of the system are noticed.

Figure 6:
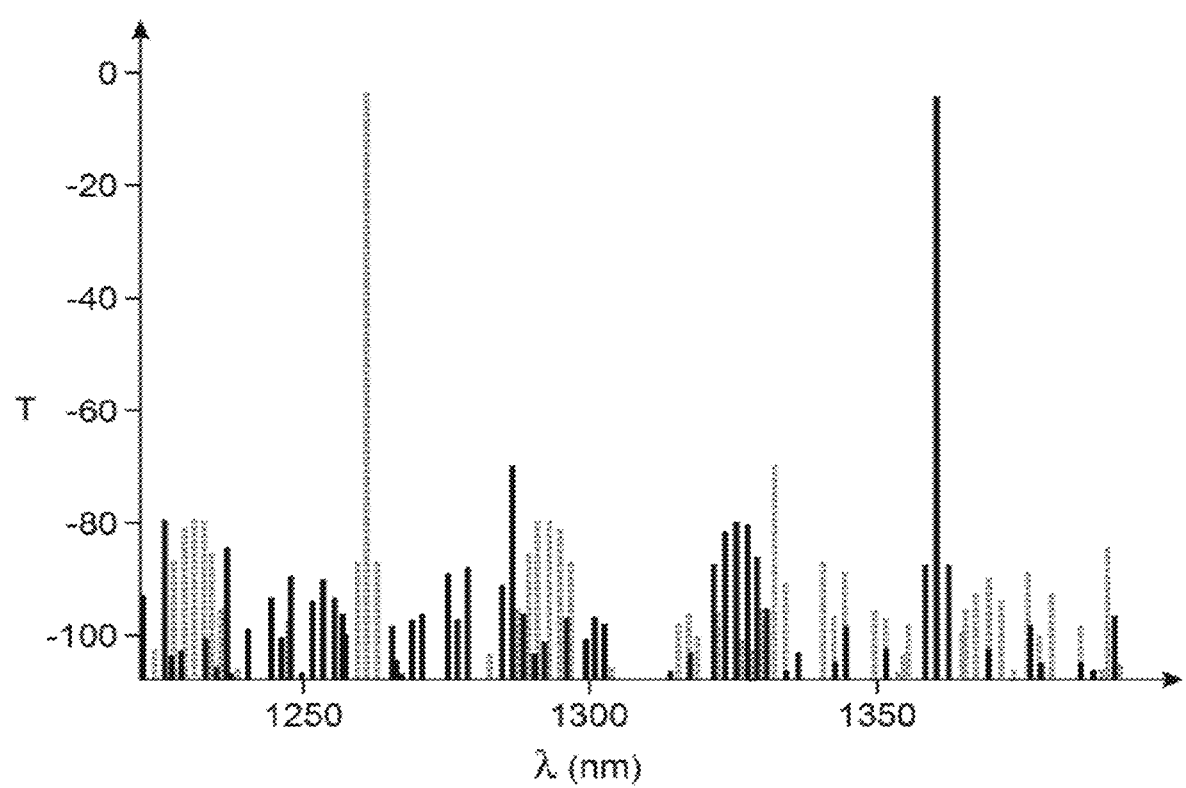
FIG. 6 represents the transmission spectrum of the five-ring filter respectively in the absence of a phase shift applied to the rings (coincidence of the individual resonances at 1231 nm) and in the presence of a phase shift applied to the rings to achieve coincidence of the individual resonances at 1361 nm.

In addition, the transmission spectrum T of the 5-ring filter has been represented in FIG. 6 without applying a phase shift (dotted lines; resonance at 1261 nm) and by applying $\Delta\phi_i$ (solid lines; resonance at 1361 nm). The applied phase shift is less than pi, that is the resonance of the rings is shifted by a maximum of half FSR. The filter is thus tunable to 100 nm with an SMSR of more than 60 dB.

Ultimately, the laser emission device can consist of a low-reflection grating coupler, Sagnac loop mirrors with improved bandwidth through the use of wide-band adiabatic directional couplers, and in the core of the tuning mechanism, a series of resonant rings with low reflectivity. The use of at least three rings makes them compatible with the achievement of a Vernier effect offering wide tunability.

In addition to its wide tuning range, the laser emission device has enhanced accuracy of the emitted wavelength. Since the management of the emitted wavelength is based on the coincidence of resonances, it proves to be possible to refine this emitted wavelength by simultaneously adjusting the N rings.

Finally, the laser emission device has the advantage of being integrated onto a semiconductor chip. Its compactness and the absence of any mechanical parts thus allow low-cost industrialisation of the optical fibre sensor with high efficiencies of microelectronic technologies.

The invention claimed is:

1. A structured optical fibre sensor, comprising a light source, a detection system and a Bragg grating optical fibre connected to said source and said detection system, wherein the light source is a wavelength tunable laser emission device which comprises:
   a first and a second Sagnac mirror;
   a cavity delimited by the first and second Sagnac mirror, the cavity comprising an amplifying medium and a tunable spectral filter using the Vernier effect, said filter comprising at least three resonant rings arranged in cascade, each resonant ring incorporating a wavelength-tunable reflectivity loop mirror.

2. The structured optical fibre sensor according to claim 1, wherein each resonant ring of said filter comprises a Mach-Zehnder interferometric section.

3. The structured optical fibre sensor according to claim 1, wherein each of the first and second Sagnac mirrors is comprised of an adiabatic directional coupler looped back through a waveguide.

4. The structured optical fibre sensor according to claim 1, wherein the cavity further comprises a phase shift section.

5. The structured optical fibre sensor according to claim 1, wherein one of the first and second Sagnac mirrors is partially reflective.

6. The structured optical fibre sensor according to claim 5, further comprising, outside the cavity on the side of that of the first and second Sagnac mirrors which is partially reflective, a tilted grating coupler to/from a single-mode optical fibre.

7. The structured optical fibre sensor according to claim 1, wherein the amplifying medium comprises an III-V heterostructure.

* * * * *